Sept. 18, 1962 D. A. LACE 3,054,970

SEMI-CONDUCTOR TYPE LOW FREQUENCY OSCILLATOR

Filed Sept. 26, 1958

INVENTOR.

Donald A. Lace,

BY Robert L. Kahn,

Attorney.

3,054,970

SEMI-CONDUCTOR TYPE LOW FREQUENCY OSCILLATOR

Donald A. Lace, Batavia, Ill., assignor to Electronic Specialties Co., Batavia, Ill., a corporation of Illinois Filed Sept. 26, 1958, Ser. No. 763,495
4 Claims. (Cl. 331—107)

This invention relates to a semi-conductor type low frequency oscillator and more particularly to an oscillator which can operate at a sufficiently low frequency so that a lamp or other relatively slow acting load may be operated. While the socillator embodying the present invention may have wide application, it is particularly useful for such devices as electric fence chargers and warning flashers which operate at a frequency of the order of a few cycles per second. It is understood, however, that the frequency may be varied over substantial limits by changing the constants of the system.

A system embodying the present invention is particularly desirable when used under conditions where the ambient temperature of the oscillator extends over a substantial range such as may occur in cold climates over the four seasons of the year. While transistor oscillators per se are not new, considerable difficulty has been experienced with such prior oscillators due to temperature effects. In particular, when the components of an oscillating system are exposed to below zero temperatures, it has been found that the frequency of operation is seriously affected and that the stability of the oscillator is also seriously impaired.

This invention provides an oscillator which is sufficient and has great operational stability over a range of temperatures to which such devices as flashers and fence chargers may be exposed. In particular, temperatures as low as —25° F. and temperatures as high as 125° F. will not impair the operation of the new oscillator to any substantial degree.

Figure 1:
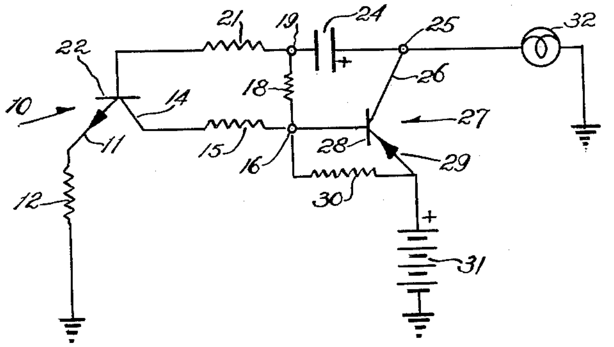

In order that the invention may be understood, reference will now be made to the drawings wherein FIGURE 1 shows one form of the invention.

Figure 2:
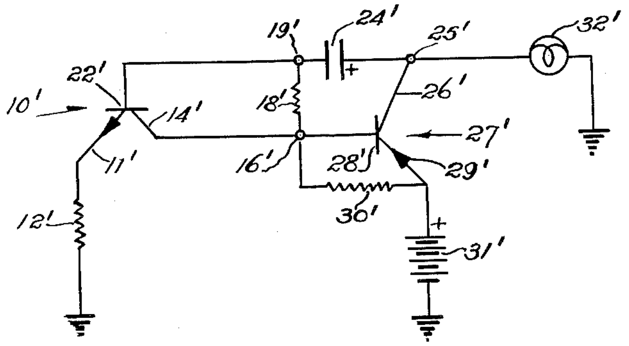
Figure 3:
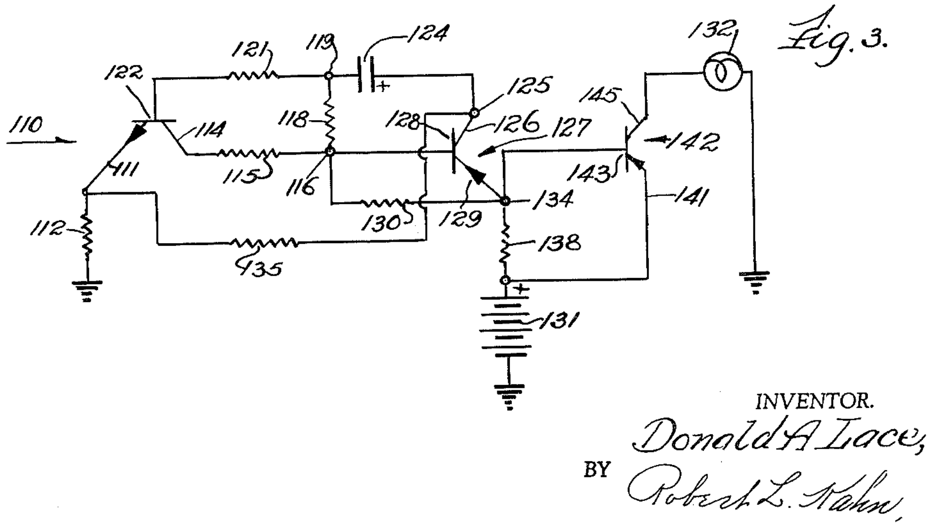

FIGURES 2 and 3 are respectively circuit diagrams showing modified embodiments of the invention.

Referring first to FIGURE 1, an NPN type of junction transistor, generally indicated by 10, has its emitter electrode 11 connected through bias resistor 12 to ground. Transistor 10 is a control transistor and has collector electrode 14 connected through resistor 15 to junction point 16. To junction point 16 is connected one terminal of resistor 18, the other terminal of which is connected to junction point 19. Resistor 21 is connected between junction point 19 and base electrode 22 of transistor 10.

Returning to junction point 19, one terminal of capacitor 24 is connected to junction point 19, the other terminal of the capacitor being connected to junction point 25. From junction point 25 a connection goes to collector electrode 26 of PNP junction transistor generally indicated by 27. The base electrode 28 of switching transistor 27 is connected to junction point 16. Transistor 27 has emitter electrode 29 connected to the positive terminal of battery 31, the negative terminal of this being grounded. Shunted across electrodes 28 and 29 is resistor 30. This resistor will generally have a value of about 1000 ohms for the particular types of transistors used and reduces leakage current when the system is not oscillating. The value of resistor 30 may be varied depending upon the transistor characteristics.

Referring to junction point 25, a load, here illustrated as lamp 32, has one terminal connected to junction point 25 and the other terminal to ground. Bias resistor 12 generally has a low value, examples of which will be given later. Resistor 15 functions to limit current flow to base 28 and has a suitable value. Resistor 18 is one of the frequency determining elements and will have a relatively high value. Resistor 21 determines the capacitor charging rate and may have any desired value.

Capacitor 24 may either be of the electrolytic type or of the non-electrolytic type using mica or paper or other similar dielectric. As a rule, the lower the value of bias resistor 12, the greater capacitor 24 must be. For high values of capacitance it is practically necessary to use electrolytic capacitors. Direct current source 31 preferably will provide current at a relatively low voltage and may, for example, consist of a storage battery or a number of dry cells to provide current at about six volts or the like. Load 32 may be an incandescent lamp bulb preferably of the type used in automobiles or may be a relay.

In an example utilizing the circuit illustrated in FIGURE 1, the following components were used.

*Example I*

| | |
|---|---|
| Transistor 10 | Type 4J2A805. |
| Transistor 27 | Type 2N320. |
| Resisotr 12 | 330 ohms. |
| Resistor 15 | 220 ohms. |
| Resistor 30 | 1000 ohms. |
| Resistor 18 | 240,000 ohms. |
| Resistor 21 | 2200 ohms. |
| Capacitor 24 | Non-electrolytic–.5 mfd. |
| Lamp—32 | 5 volt–.060 amp. |
| Source 31 | 6 volts D.C. |

A flasher as constructed above will operate at a frequency of about one cycle per second.

The above example provides a high gain type of oscillator.

The circuit illustrated in FIGURE 1 may be modified by making the following changes.

*Example II*

| | |
|---|---|
| Capacitor 24 | (Electrolytic 6 volts D.C.) 8 mfd. |
| Resistor 12 | 68 ohms. |
| Resistor 18 | 150,000 ohms. |
| Resistor 21 | 2200 ohms. |

The remaining components are as given in Example I. Lamp 32 may have a current rating up to .150 ampere.

The operating frequency for this example is about one cycle per second.

Referring to FIGURE 2, it will be observed that the circuit illustrated in this figure differs somewhat from the circuit illustrated in FIGURE 1 by the omission of resistors 15 and 21. Capacitor 24 may be of the electrolytic type. A typical example for the circuit illustrated in FIGURE 2 is as follows:

*Example III*

| | |
|---|---|
| Resistor 12′ | 220 ohms. |
| Resistor 18′ | 150,000 ohms. |
| Capacitor 24′ | (Electrolytic 6 volts D.C.) 8 mfd. |

The transistors and load are the same as in Examples I and II.

FIGURE 2 illustrates a direct coupled oscillator and the operating frequency of an oscillator as given in Example III is also about one cycle per second.

Referring now to FIGURE 3, a still further modified system is illustrated wherein the capacitor may be of the electrolytic type and wherein the circuit utilizes three transistors with reflex loading. Referring to FIGURE 3, transistor 110 has emitting electrode 111 connected through bias resistor 112 to ground. Collector electrode 114 is connected through resistor 115 to junction point 116. Resistor 118 is connected between junction point 116 and junction point 119. Resistor 121 is connected between junction point 119 and base electrode 122.

Connected to junction point 119 is one terminal of capacitor 124, the other terminal of which is connected to junction point 125. Junction point 125 is connected to collector electrode 126 of transistor 127. Base electrode 128 of this transistor is connected to junction 116. Transistor 127 has its emitter electrode 129 connected to junction point 134. Collector electrode 126 which is connected to junction 125 is also connected through resistor 135 back to emitting electrode 111 of transistor 110. Resistor 130 is connected across electrodes 128 and 129.

Junction point 134 is connected through resistor 138 to terminal 139 of power supply 131. Terminal 139 in this instance is positive, the other terminal of the power supply being grounded. Terminal 139 of the power supply is connected to emitter electrode 141 of type PNP transistor 142. Transistor 142 has its base electrode 143 connected through load 132 to ground.

In the above system, transistors 110 and 127 correspond respectively, insofar as types are concerned, to transistors 10 and 27 of FIGURES 1 and 2. In all cases it is to be understood that if the polarity of the current source is reversed, it will be necessary to change the type of transistor. Thus, in each instance in the case of reversal of polarity of current source, a PNP transistor will have to be replaced by an NPN type transistor and an NPN resistor will have to be replaced by a PNP. This expedient is well known in the art.

In the above system illustrated in FIGURE 3, lamp 132 may constitute a much heavier load than in the systems previously described. Insofar as the oscillator is concerned, this including transistors 110 and 127, the load is substantially constant. An example of a system embodying FIGURE 3 is herewith given.

*Example IV*

| | |
|---|---|
| Transistor 110 | Type 452A805. |
| Transistor 127 | Type 2N320. |
| Transistor 142 | 2N167. |
| Resistor 112 | 68 ohms. |
| Resistor 115 | 330 ohms. |
| Resistor 118 | 250,000 ohms. |
| Resistor 121 | 6800 ohms. |
| Resistor 130 | 1000 ohms. |
| Resistor 135 | 330 ohms. |
| Capacitor 124 | (Electrolytic 6 volts D.C.) 3 mfd. |
| Lamp 132 | 5 volts 1.25 amps. |
| Source 131 | 6 volts D.C. |

A circuit following Example IV will oscillate at a frequency of about one cycle per second.

The system illustrated in FIGURE 3 has certain advantages over the systems illustrated in FIGURES 1 and 2. For example, the resistance of load 132 is not reflected into control transistor 111. In the event that lamp 132 is burned out, the oscillator will still function and will not stop as is true of the oscillators illustrated in FIGURES 1 and 2.

The three oscillators illustrated in the drawings are fundamentally R–C type oscillators, this type being generally known in the vacuum tube art. The oscillator frequency is generally a function of the value of capacitor and the value of certain resistors. The reason for the distinction between electrolytic and non-electrolytic types of capacitors is due to the leakage characteristics. As is well known, electrolytic capacitors have a significant leakage current. Due to the low impedances of the transistor input circuits, there is a likelihood of erratic operation with high gain types of circuits as in Example I if electrolytic capacitors are used. However, as transistors are improved it may be that the circuits will be independent of capacitor characteristics.

A transistor has a leakage current and in the case of the particular types used here, the leakage current may be of the order from about 2 to about 7 milliamps. In order to reduce this leakage, resistor 30, in FIGURE 1, resistor 30′ in FIGURE 2 and resistor 130 in FIGURE 3 have been provided. With the values used, it has been found that the drain has been cut down to the order of about .3 milliamps. This greatly improves performance and reduces battery drain. The value of this resistor is not critical and may be varied over substantial limits. However, too high a resistor will be equivalent to no resistor at all and will increase drain. Too low a resistor will also increase the drain. In general, the leakage control resistor may range from about 500 ohms to as much as 2500 ohms with beneficial effects.

For simplicity, the circuit of FIG. 1 will be considered in detail. When battery 31 is first connected, capacitor 24 charges through the emitter-collector of transistor 27 and base emitter circuit of transistor 10. The polarity of the loop circuit permits the charging action to continue until the capacitor is fully charged. A positive going signal appearing across lamp 32 is coupled back through capacitor 24 of the input of transistor 10. The positive going signal here increases the collector current for transistor 10, thus increasing the base current of transistor 27 and further increasing the collector current of transistor 27 as charging continues. The above action corresponds to the "on" time for lamp 32 since during this phase of operation transistor 27 emitter to collector is effectively a short, thus placing battery 31 across lamp 32.

After capacitor 24 is fully charged, there can be no further increase in the positive going signal applied to the base of transistor 10 and hence the base current and collector current of transistor 10 drop close to zero. A drop in the collector current of transistor 10 drops the base current (hence the collector current) of transistor 27, virtually "opening" the emitter collector circuit of transistor 27. This effectively removes the charging source (battery 31) from the charging circuit for capacitor 24. This transistor switching of the battery from the capacitor charging circuit also opens the battery circuit through lamp 32.

The electronic removal of battery 31 from the capacitor charging circuit results in capacitor 24 beginning to discharge. The principal discharge path for capacitor 24 and thus the principal timing combination consists of a path from ground, through lamp 32 and capacitor 24, resistors 18 and 30 and battery 31 to ground. The discharge current through lamp 32 is too small to light it. The transistors are not involved to any substantial degree in the discharge phase, insofar as back resistances are concerned.

It is clear that the circuits of FIGS. 1 and 2 are similar so far as the above analysis is concerned. In FIG. 3, the discharge path for capacitor 124 runs from point 119, resistors 118 and 130 to point 134 and down through resistor 138 and battery 131 to ground, then resistors 112 and 135 to point 125 and through capacitor 124. In this modification, resistor 135 takes the place of lamp 32 in FIG. 1. Resistor 138 couples the oscillator circuit to a simple switch stage.

In all cases, the capacitor discharge path is principally through discrete resistors which can be accurate and insensitive to temperature changes.

The relative ratios of "on" and "off" time may be adjusted to desired values by changing the values of resistors. Referring to FIGURE 1 for example, resistor 21 should be greater to increase "on" time. Resistor 18 should be greater to increase "off" time. The effects of changing these resistors, however, are not independent.

What is claimed is:

1. A free running relaxation type oscillator having two complementary junction type transistors, each transistor having a base, emitter and collector electrode, one transistor being a control transistor and the other being a switching transistor, a first resistor connected between the control transistor emitter and ground, a battery having one terminal grounded, a second and third resistor connected in series between the other battery terminal and a junction point, a capacitor connected between said junction point and one load terminal, the other terminal for said load being grounded, a direct current connection between the control transistor collector and the junction between the second and third resistors, a direct current connection between the last named resistor junction and the switching transistor base, a direct current connection between the switching transistor collector and said one load terminal, a direct current connection between said first named junction point and the base of said control transistor, a metallic connection between the switching transistor emitter and the other battery terminal, the battery polarity being such that when the control transistor is of the NPN type, the negative terminal of the battery is grounded, said oscillator having the following desirable characteristics, when the battery is applied, both transistors are in the conducting or "On" condition, so that quick and positive starting is assured under various ambient conditions of temperature and the switching transistor base is temperature stabilized by the second and third resistor network and the control transistor emitter is temperature stabilized by the first resistor whereby the oscillator characteristics are stable in spite of temperature variations.

2. The circuit according to claim 1 wherein a fourth resistor is provided in the connection between said first named junction point and the base of the control transistor.

3. The circuit according to claim 2 wherein a fifth resistor is provided in the connection between the collector of the control transistor and the junction point between the second and third resistors.

4. The circuit according to claim 1 wherein a load resistor is connected between the one load terminal and the emitter of the control transistor, the direct current connection between the other battery terminal and the switching transistor emitter including a coupling resistor and an additional transistor switching stage connected to operate across said coupling resistor, the load terminals being ground and collector electrode of the additional switching transistor.

References Cited in the file of this patent

UNITED STATES PATENTS

| | | |
|---|---|---|
| 2,769,907 | Lohman | Nov. 6, 1956 |
| 2,812,437 | Sziklai | Nov. 5, 1957 |
| 2,829,257 | Root | Apr. 1, 1958 |
| 2,831,113 | Weller | Apr. 15, 1958 |
| 2,839,686 | Tompkins | June 17, 1958 |
| 2,901,669 | Coleman | Aug. 25, 1959 |
| 2,918,607 | Peepas et al. | Dec. 22, 1959 |

FOREIGN PATENTS

| | | |
|---|---|---|
| 801,453 | Great Britain | Sept. 17, 1958 |

OTHER REFERENCES

"PNP," "NPN" Oscillators by E. G. Louis in "Radio and Television News," pages 105–107, July 1956.